July 3, 1962 W. MICHLIN 3,042,593
ELECTROCHEMICAL METHOD FOR CLEANSING SEMICONDUCTIVE DEVICES
Filed Sept. 23, 1957
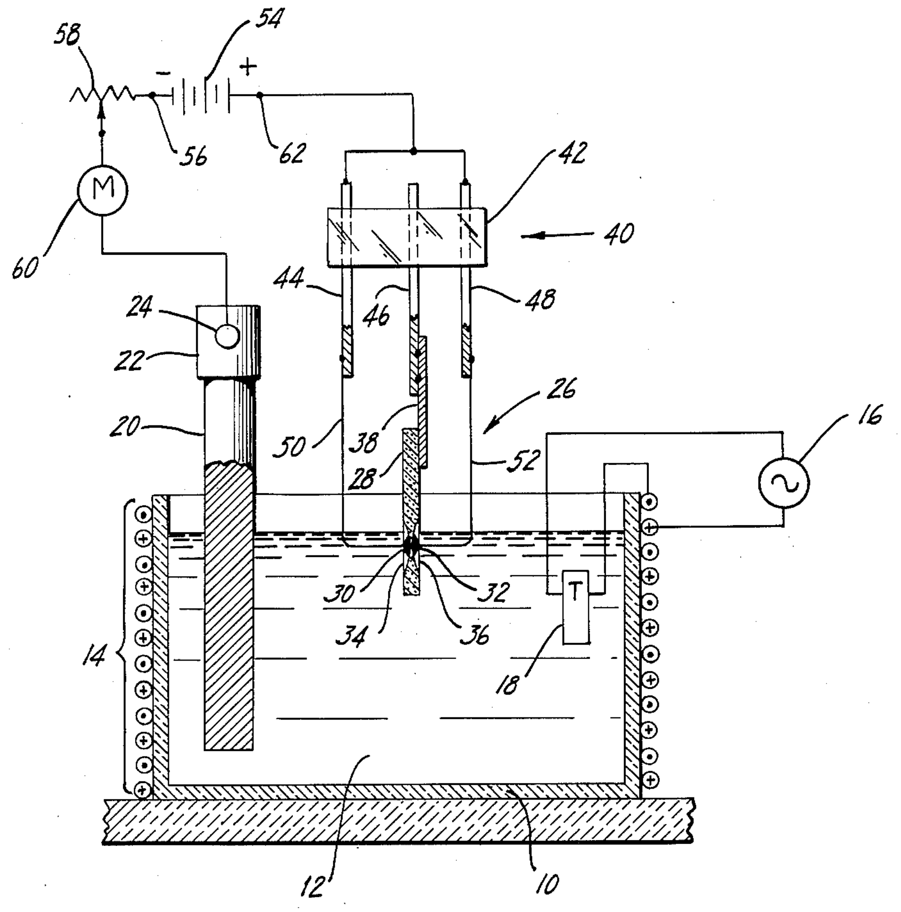
INVENTOR.
WILLIAM MICHLIN
BY
Herbert Epstein
AGENT 3,042,593

ELECTROCHEMICAL METHOD FOR CLEANSING SEMICONDUCTIVE DEVICES

William Michlin, Philadelphia, Pa., assignor, by mesne assignments, to Philco Corporation, Philadelphia, Pa., a corporation of Delaware Filed Sept. 23, 1957, Ser. No. 685,536
13 Claims. (Cl. 204—141)

This invention relates to an improved electrochemical method for fabricating semiconductor devices and to a novel solution utilized in practicing this improved method. More particularly it relates to an improved method and solution for electrochemically cleansing the region of a semiconductive body adjacent a rectifier electrode positioned thereon.

In order that semiconductor devices such as transistors and diodes of the alloy-junction and surface-barrier variety shall operate efficiently and reliably, it is essential that the surface of the semiconductive body, particularly that portion nearest the rectifier electrode or electrodes of the device, be substantially free of contaminating substances which tend to reduce the diode breakdown voltage of the rectifying electrode. In this regard, the diode breakdown voltage is that voltage which when applied in a reverse-biasing sense between the rectifying electrode and the semiconductive body, has a magnitude just sufficient to cause the reverse current of the diode to exceed a prescribed substantial intensity. Such reductions in the diode breakdown voltage of a semiconductive device are undesirable because they limit unduly the maximum signal and biasing voltages which may be applied across a diode, or between the collector and base elements of a transistor, and thus limit the range of application of the device. For example, a reduced diode breakdown voltage is highly undesirable in transistors intended for use in computer circuits because in such devices, the use of relatively high collector voltages has been found to be advantageous.

The importance of cleansing the surfaces of the semiconductive body of a semiconductor device adjacent its rectifier electrodes has long been recognized by the art, and various expedients have been proposed for accomplishing this function. For example, a chemical method has been proposed wherein the semiconductor device, after its mechanical fabrication and just prior to its encapsulation, is dipped into an acid solution which, in one instance, may be composed of 100 milliliters of hydrofluoric acid (48%), 100 milliliters of glacial acetic acid, 200 milliliters of concentrated nitric acid, and 0.3 milliliter of bromine. While such an acid solution cleanses effectively the surfaces of the principal semiconductive materials, e.g. germanium and silicon, its use may be disadvantageous in various significant respects. Specifically, because of its considerable chemical activity, this solution attacks not only the contaminants present on the surface of the semiconductive body but also the metal rectifier electrodes and connecting wires thereto. Because these metal elements undergo chemical oxidation in reacting with the acid solution, the etchant soon contains a substantial metal-ion concentration which rises with the dipping thereinto of each successive transistor.

As this metal-ion concentration in the acid solution rises, these ions tend increasingly to redeposit on the semiconductive body surfaces of succeeding transistors or diodes dipped therein. As a result, the latter units tend to have poor electrical characteristics, e.g. low diode breakdown voltages, and accordingly are commercially unusable. Thus, where the acid solution is used as a cleansing agent, it is necessary to replenish the solution frequently to avoid these undesirable redepositions, a procedure which is expensive both in materials and time.

A second cleansing technique of the prior art comprises the electrochemical etching in a concentrated alkaline solution of the semiconductive body. For example, in one form of this method, the semiconductive body of a transistor or diode, together with an inert electrode, are immersed in a concentrated solution of sodium hydroxide or potassium hydroxide. A positive potential is applied to the rectifier electrode or electrodes of the device, while a negative potential is applied to the inert electrode. Under these conditions, it is found that the semiconductive body region adjacent each rectifier electrode of the device is etched electrolytically, thereby removing the contaminating substances present on the etched surface.

However the latter method of cleansing also produces undesirable results which limit its usefulness insofar as commercial production is concerned. Specifically, where the rectifier electrodes of the semiconductor device undergoing cleansing are composed of the metals indium, gallium or aluminum, or combinations of two or more of these metals, as is frequently the case in commercially produced semiconductor devices, the strong hydroxide solution reacts chemically with these metal electrodes to produce compounds, believed to be the hydroxides of the electrode metals, which are highly insoluble in the electrolyte. These insoluble compounds in turn deposit themselves on the surfaces of the semiconductive body undergoing cleansing in a form which clings tenaciously to these surfaces and is accordingly very difficult to remove even by extended washing with water. In fact, it is frequently necessary to immerse a device coated with these undesirable compounds in an acid solution for a substantial time in order to dissolve them. In any event they cannot be permitted to remain on the body surface because they too reduce the diode breakdown voltage. Even where these compounds are deposited on the surface in a quantity which is not great enough to cause a perceptible film to appear thereon, it is nonetheless found that the electrical performance of the semiconductor device is deleteriously affected thereby.

Accordingly it is an object of my invention to provide an improved electrochemical method for fabricating semiconductor devices.

Another object is to provide an improved solution which is especially well suited for use in practicing my novel electrochemical method.

A further object is to provide an improved electrochemical method for cleansing the surface of a semiconductor body having a rectifier electrode affixed thereto, and particularly the surface portion adjacent this rectifier electrode.

Still another object is to provide an improved electrochemical method for cleansing the surfaces of semiconductor bodies, particularly adjacent rectifier electrodes affixed thereto, which method leaves no undesired deposits on the surfaces of the bodies.

An additional object is to provide an improved electrochemical method for cleansing the surfaces of a transistor adjacent the emitter and collector electrodes thereof, which method selectively etches the body surface portion adjoining these elements without however attacking the electrodes themselves to any substantial extent.

Yet another object is to provide a method for treating semiconductor devices, comprising a semiconductive body having at least one rectifier electrode affixed thereto, in a manner such that said rectifier electrode exhibits an unusually high diode breakdown voltage.

A still further object of my invention is to provide an electrochemical method for cleansing the bodies of semiconductor devices which is easy to practice and is therefore readily suited to commercial production.

An important object of my invention is to provide an improved solution which facilitates the electrochemical cleansing of semiconductive bodies having rectifier electrodes affixed thereto, while not chemically reacting to any substantial extent with either the semiconductor bodies themselves or the rectifier electrodes.

Yet another important object is to provide an improved solution for use in electrochemically cleansing a semiconductive body, the constituents of which solution are inexpensive and easily obtained.

All of the foregoing results are achieved, in accordance with my invention and specifically in the fabrication of a semiconductor device which comprises a semiconductive body and a rectifier electrode positioned thereon, by immersing the portion of the semiconductive body bearing said rectifier electrode in an electrolytic solution while maintaining said electrode at a potential positive with respect to the solution, e.g. by applying an appropriately poled voltage between the rectifier electrode and an inert electrode immersed in the solution. In accordance with an important aspect of my invention, this solution consists essentially of water, a first substance composed of at least one compound selected from the group consisting of sodium hydroxide and potassium hydroxide, for supplying hydroxyl ions to the solution, and a second substance composed of at least one compound selected from the group consisting of sodium cyanide and potassium cyanide, for supplying cyanide ions to the solution, the hydroxyl ions and the cyanide ions having respective molal concentrations in said water such that the quotient equal to the concentration of the hydroxyl ions divided by the concentration of the cyanide ions has a value lying between about 0.25 and zero.

In a more specific embodiment of my novel process, the semiconductive body is preferably composed of n-type semiconductive material and the solution is maintained at a temperature lying between about 90° C. and the boiling point of the solution. In addition, the hydroxyl ion concentration is one molal, while the cyanide ion concentration is four molal. Even more specifically, in a further preferred embodiment of my method, the solution consists of potassium cyanide and potassium hydroxide in concentrations of four molal and one molal, respectively, and is maintained at a temperature of approximately 112° C., i.e. approximately its boiling point.

When my novel solution, described hereinbefore, is used in practicing my novel method, it is found that the surface of the semiconductive body adjacent each rectifier electrode appears clean even when examined under a powerful microscope. In particular there are substantially no redeposits of substances which have been etched in the course of practicing my steps. Moreover, the rectifier electrodes of semiconductor devices which have been subjected to my process exhibit uniformly high diode breakdown voltages.

It is believed that these highly desirable results, attained in accordance with my invention, are made possible by a tendency of the cyanide ion to combine with numerous metallic ions, thereby to form extremely stable and soluble complex ions within which the etched metal ion is so firmly bound that it cannot redeposit on the semiconductive body. This tendency of the cyanide ion to combine with metal ions is particularly pronounced with respect to metals such as copper, indium, cobalt, and gallium, which frequently are present as contaminants on the surfaces of semiconductive bodies.

Moreover the hydroxide compound or compounds present in the preferred forms of my solution suppress the release of deadly cyanogen gas, $(CN)_2$, which tends to form during the electrolysis. This the hydroxide compounds do by reacting with the cyanogen, as soon as it is produced, to form the cyanide and cyanate salts of the cations of the hydroxide compounds. Because none of these salts volatilizes appreciably at the temperatures at which my process is carried out, none tends to poison the atmosphere as does the cyanogen gas. However, it is to be noted that, aside from these toxicity considerations, the hydroxide compounds are not essential inasmuch as sufficient ionic current carriers are provided by the cyanide compounds. Accordingly in those instances where my process is practiced within a closed ventilating system capable of safely disposing of cyanogen, the hydroxide compounds may be omitted entirely.

By contrast, there is a maximum concentration relative to that of the cyanide compounds which the hydroxide compounds must not exceed. Specifically, it has been found that where the ratio of the molal concentration of the hydroxyl ions to that of the cyanide ions is substantially above 0.25, e.g. 0.50 and higher, there is a tendency for the hydroxide compounds to form the aforementioned undesirable insoluble deposits. Accordingly, the respective concentrations of the hydroxyl and cyanide ions are preferably established at values such that their molal ratio lies between substantially 0.25 and zero.

Other advantages and features of the invention will become apparent from the consideration of the following detailed description taken in connection with the accompanying drawing in which the single FIGURE illustrates diagrammatically an electrolytic etching arrangement suitable for use in practicing my invention.

More particularly, the drawing illustrates a vessel 10 which may be made of an inert insulating material such as glass or fused quartz. Importantly this insulating material should be substantially insoluble in cyanides and hydroxides. Vessel 10 contains my novel electrolytic solution 12 the composition of which is discussed in detail hereinafter. This solution is preferably maintained, by means of a heating element, at a temperature of 90° C. or higher and, in the specific embodiment discussed herein, is maintained substantially at the boiling point of solution 12. In the arrangement illustrated by the drawing, this heating element, indicated in cross section at 14, is bifilar and is arranged to surround vessel 10. To supply energy to heating element 14, a source of alternating current 16 is provided, which is connected to heating element 14 by way of a thermostatic switch 18. Thermostatic switch 18, which is immersed in solution 12, is constructed and arranged to complete the electrical circuit between source 16 and heating element 14 whenever the temperature of solution 12 falls below a predetermined value, which as aforementioned is approximately equal in this embodiment to the boiling point of the solution.

Immersed in solution 12 is an inert electrode 20 which serves as the cathode element in the electrolytic cleansing process of my invention. In one preferred form, this inert electrode comprises a rod of spectrographically pure graphite having a metal clamp 22 affixed to the unimmersed end of electrode 20 and affording good electrical connection thereto. Clamp 22 in turn comprises a binding post 24 for securing a wire lead thereto.

Also immersed in solution 12 is a portion of a transistor 26 whose surfaces adjacent its rectifier electrodes are to be cleansed. Transistor 26 is drawn to an enlarged scale to illustrate clearly certain structural details thereof. As shown by the drawing, transistor 26 comprises a rectangular wafer 28 of semiconductive material typically having a length and width of 0.150 and 0.075 inch, respectively, and a thickness over most portions thereof of about 0.004 inch. In the specific embodiment herein discussed, wafer 28 is composed of n-type germanium having a resistivity of between 1 and 1.2 ohm-centimeters.

In addition transistor 26 comprises, as first and second rectifier electrodes, surface-barrier emitter and collector electrodes 30 and 32, respectively, which are positioned substantially coaxially within substantially coaxial depressions 34 and 36, respectively, formed on opposing surfaces of wafer 28. Typically emitter and collector electrodes 30 and 32 may each be fabricated of indium and may have a diameter of 0.015 inch, while depressions 34 and 36 may each have a diameter of 0.030 inch. Depressions 34 and 36, and hence emitter and collector electrodes 30 and 32, respectively, may be separated from one another by a minimum distance of the order of 0.0002 inch.

To provide a substantially ohmic connection to wafer 28, a base tab 38 which may be constituted of nickel is secured thereto with an appropriately doped solder. In addition, to afford external connections to emitter and collector electrodes 30 and 32 respectively, and base tab 38 of transistor 26, there is also provided a stem assembly 40 including a cylindrical body 42 composed of an insulating material such as glass or a plastic, within which are embedded three wire leads designated respectively as 44, 46 and 48. The base tab 38 is spot-welded to central wire lead 46 while one of the ends of each of two small-diameter connecting wires 50 and 52 respectively are spot-welded to peripheral wire leads 44 and 48, respectively. In addition the other ends of each of connecting wires 50 and 52 (which typically are composed of nickel) are secured to emitter and collector electrodes 30 and 32 respectively by a solder which typically may be the cadmium-indium eutectic.

While I have just described one form of transistor which may be cleansed by practicing my novel method, it is to be understood that my method is by no means limited in its application to cleansing this specific form of transistor. On the contrary my method can be employed advantageously for cleansing many other forms of transistors as well as other semiconductor devices.

To energize my novel electrolytic process, there is provided a source of direct voltage 54, the negative pole 56 of which is connected to inert electrode 20 by way of a variable resistor 58, a milliammeter 60 and binding-post 24 and the positive pole 62 of which is connected to the emitter and collector electrodes 30 and 32, respectively, of transistor 26, by way of the stem leads 44 and 48 respectively and connecting wires 50 and 52 respectively.

In accordance with my invention, electrolytic solution 12, which when utilized in practicing my novel method produces the new and highly useful results set forth above, consists essentially of water, a first substance which consists of either potassium hydroxide or sodium hydroxide or both, and a second substance which consists of either potassium cyanide or sodium cyanide or both. Importantly the first and second substances have respective concentrations in the water such that the quotient obtained by dividing the concentration of hydroxyl ions by the concentration of cyanide ions has a value between substantially 0.25 and zero. Because each of the designated cyanide and hydroxide compounds dissociates substantially completely and because the designated cations and anions are univalent, the total of the molal concentrations of the constituents of the first substance in practice is made equal to the desired hydroxyl ion concentration, while the total of the molal concentrations of the constituents of the second substance in practice is made equal to the desired cyanide ion concentration. Thus in the preferred embodiment, wherein the first and second compounds are respectively potassium hydroxide and potassium cyanide, the respective concentrations of these compounds are one and four molal, and the molal ratio is substantially 0.25.

In practicing the preferred form of my novel method, the following steps are carried out. Prior to immersing transistor 26 in solution 12 and connecting positive pole 62 of source 54 to its emitter and collector electrodes 30 and 32 respectively, transistor 26 is rinsed for a few minutes e.g. 5 minutes, in hot, distilled deionized water, e.g. water having an average temperature of about 90° C., thereby to remove from the surface of wafer 28 a substantial proportion of those contaminants which are water soluble. The positive pole 62 of source 54 is then connected to leads 44 and 48 respectively, and hence to emitter and collector electrodes 30 and 32 respectively of transistor 26, and the transistor is dipped several times, for example 8 to 15 times, into my novel solution 12. Each dip of transistor 26 into solution 12 may last for approximately a half second. The purpose of dipping the transistor in and out of the solution during etching is to aid in dissipating gas bubbles formed on the transistor surface during the electrolysis. In performing this dipping step, it is preferable that transistor 26 be immersed to a depth such that solution 12 wets only up to a level slightly above the rectifier electrodes 30 and 32, and in particular that base tab 38 is not immersed. In this way, the unnecessary etching and introduction into the electrolytic solution of metals contained in the base tab and its solder is avoided, and the effective life of the solution is thereby substantially lengthened since cyanide ions are not expended in sequestering these metals.

Where the preferred electrolytic solution of four molal potassium cyanide and one molal potassium hydroxide is used, thermostat 18 is adjusted to maintain the solution at 112° C., i.e. its boiling point. In addition the source 54 may be selected to have an output voltage of 3 volts, while the resistance of variable resistor 58 is adjusted so as to cause a current of 80 to 100 milliamperes to flow through the electrolytic circuit when wafer 28 is immersed therein.

Under these conditions the surfaces of wafer 28, particularly in the vicinity of emitter and collector electrodes 30 and 32 respectively, undergo vigorous electrolytic etching. This etching oxidzies into ionic form not only a portion of the germanium composing the wafer but also the various metallic impurities present on the surfaces of wafer 28 which, though their concentration generally is small, affect deleteriously the operation of the transistor if permitted to remain thereon. In accordance with an important result of my invention, as these metals are electrolyzed into ionic form from the surfaces of wafer 28, these metallic ions immediately combine with the cyanide ions present in high concentration in electrolytic solution 12, to form very soluble and stable metallocyanide complex ions. Because of the stability of these complex ions, the metal atoms which form a part thereof become and remain substantially unavailable for redeposition onto the surfaces of wafer 28 even though the etching of many successive transistors tends to increase the metal ion concentration of solution 12 to a level which in prior art solutions would have been more than sufficient to cause redeposition of metal on the semiconductive surfaces of the transistors being cleansed. Thus numerous transistors can be etched in solution 12 in accordance with my novel method, without redeposition of etched contaminants onto the body of a subsequent transistor. The solution need only be replenished when the concentration therein of uncombined cyanide ions has fallen to a low value.

After performing this etching step of my novel method, transistor 26 is removed from the bath and is rinsed in hot, distilled water, thereby to remove the electrolytic solution therefrom. It is preferable that the transistor be immersed to a depth which permits the water to cover substantially only the lower portion of wafer 28 and emitter and collector electrodes 30 and 32 respectively, and that the rinsing water be substantially free of ions, which might deposit on the freshly cleansed surfaces of wafer 28. This rinsing step is preferably continued for five minutes in water heated to approximately 90° C.

After transistor 26 has been rinsed, it is then placed within an evacuated chamber for 12 hours, thereby to remove moisture from the transistor. A measurement of the diode breakdown voltage is then made in a dry atmosphere, e.g. in dry nitrogen In those few instances where the transistor shows an inordinately low breakdown voltage, indicative of insufficient cleansing of its wafer surfaces, it is re-etched according to my method. By contrast, where its breakdown voltage is adequately high, the transistor may be encapsulated and hermetically sealed in cans (not shown) filled with an inert potting compound.

When the foregoing steps are carried out, it is found that the transistors thus manufactured have uniformly high diode breakdown voltages. Moreover no deleterious deposits may be discerned on the surfaces of the semiconductive body even by examination under a powerful microscope.

As aforementioned, in practicing the above-described form of my novel method, I repeatedly dip the transistor to be cleansed into the electrolytic solution, thereby dislodging gas bubbles on the surface as well as closing the electrolytic circuit. However, such a dipping action is not essential to the practice of my novel process. For example, where it is desired to immerse transistor 26 in solution 12 without employing the dipping action, the gas bubbles evolved during electrolysis may be dislodged merely by stirring the solution. In fact the presence of evolved gas bubbles on the surfaces of wafer 28 is not especially harmful, acting primarily to reduce the rate of etching. Hence, where cleansing speed is not of primary importance, my method may be carried out merely by immersing wafer 28 in solution 12, preferably only sufficiently to submerge emitter and collector electrodes 30 and 32 respectively. A potential is then applied to emitter and collector electrodes 30 and 32 respectively which is positive with respect to that of inert electrode 20 and has a value such that an initial current of 20 to 30 milliamperes passes through the electrolytic circuit. This voltage is preferably maintained for about ten seconds. It is found, under these conditions, that the intensity of the current falls within the first second to about 15 to 10 milliamperes and then remains relatively constant during the remainder of the immersion. As in the preceding embodiment the method is carried out utilizing my novel solution, which is preferably maintained at a temperature between 90° C. and 112° C.

While in the preceding discussion the solute of my novel solution has been described specifically as consisting essentially of potassium cyanide and potassium hydroxide, it may alternatively consist of sodium cyanide and potassium hydroxide, potassium cyanide and sodium hydroxide, sodium cyanide and sodium hydroxide, or combinations of all four of these substances. In each instance, the preferred solution consists of a four molal concentration of the cyanide compound or compounds and a one molal concentration of the hydroxide compound or compounds. In this regard, it is seen that the preferred molal concentration ratio of hydroxide compounds to cyanide compounds, i.e. 0.25, obtains herein. However, and as aforementioned, where my process is carried out within a ventilating system which can dispose safely of poisonous cyanogen fumes, the concentration of the hydroxide compound or compounds utilized in my novel solution can be diminished, or, in the limit, the hydroxide compounds can be omitted entirely. Thus, my invention contemplates a molal ratio between the respective concentrations of the cyanide and hydroxide compounds lying between substantially 0.25 and zero.

By contrast, and as also aforementioned, I have found that it is undesirable to raise the molal concentration ratio of hydroxide compounds to cyanide compounds substantially above 0.25, e.g. to 0.50 or higher, because under these conditions, various undesirable precipitates tend to form which may then deposit on the surfaces of the semiconductive body being cleansed.

In addition, while the preferred concentrations of the cyanide and hydroxide compounds are four and one molal respectively, the use of such high concentrations is not essential to the successful practice of my method. For example the concentration of the cyanide compound or compounds may be as low as 0.1 molal, and a concomitantly small concentration of the hydroxide compound or compounds, e.g. 0.025 molal, may be employed. Nonetheless it is preferable to have relatively high concentrations of cyanide ions to promote efficient complexing of these ions with the ions of metals etched from the semiconductive body.

However it is also desirable that the concentrations of the cyanide and hydroxide compounds in my solution be not so great as to saturate the solution with either of these compounds. Specifically, it is preferable that the concentrations of the cyanide and hydroxide compounds not rise above the values of 6 molal and 1.5 molal respectively, inasmuch as at or above these concentrations there is a tendency for a semi-solid mass to form within and permeate the solution, thereby inhibiting effective cleansing of the semiconductive body.

Moreover while my process has been described with respect to transistors having n-type germanium bodies it may also be applied to transistors having n-type silicon bodies or p-type germanium or silicon bodies, as well as bodies composed of other semiconductive materials.

Furthermore my novel process may be used to cleanse semiconductor devices other than transistors, e.g. semiconductor alloy-junction, microalloy, or surface-barrier diodes.

While I have described my invention by means of specific examples and in a specific embodiment, I do not wish to be limited thereto, for obvious modifications will occur to those skilled in the art without departing from the scope of my invention.

What I claim is:

1. A method for cleansing a semiconductor device which comprises a body of semiconductive material and a rectifier electrode positioned thereon containing at least one metal selected from the group consisting of aluminum, gallium and indium, said method comprising the steps of: applying an electrolyte to said electrode and to the surface portion of said body surrounding said electrode while maintaining said electrode at a potential positive with respect to said electrolyte; said electrolyte consisting essentially of water, a first substance composed of at least one compound selected from the group consisting of sodium hydroxide and potassium hydroxide, for supplying said electrolyte with hydroxyl ions, and a second substance composed of at least one compound selected from the group consisting of sodium cyanide and potassium cyanide, for supplying said electrolyte with cyanide ions, said first and second substances having respective concentrations in said water such that the hydroxyl ion concentration therein is between about 0.025 molal and about 1.5 molal, the cyanide ion concentration therein is between about 0.1 molal and about six molal, and the quotient of said hydroxyl ion concentration divided by said cyanide ion concentration has a maximum value of about 0.25.

2. The method of claim 1 wherein said respective concentrations of said first and second substances are such that said quotient has a value of about 0.25.

3. The method of claim 1, wherein said body is constituted of n-type semiconductive material, and said solution is maintained at a temperature between about 90 degrees centigrade and the boiling point of said solution.

4. The method of claim 1, wherein said semiconductive material is n-type germanium and said rectifier electrode comprises at least one metal selected from the group consisting of aluminum, gallium and indium.

5. The method of claim 3 wherein said concentration of said second substance is such that said concentration of said cyanide ions is substantially four molal.

6. The method of claim 5, wherein said concentration of said first substance is such that said concentration of said hydroxyl ions is substantially one molal.

7. An improved method for the electrochemical cleansing of semiconductor devices which comprise a body composed of n-type germanium and a rectifier electrode positioned on said body, said electrode containing at least one metal selected from the group consisting of aluminum, gallium and indium, said method comprising the steps of: applying to said rectifier electrode a potential positive with respect to that of an inert electrode immersed in an electrolytic solution; and immersing in said solution the portion of said body on which said rectifier electrode is positioned, while agitating said solution; said solution consisting essentially of water, a first compound selected from the group consisting of sodium hydroxide and potassium hydroxide, and a second compound selected from the group consisting of sodium cyanide and potassium cyanide, said first compound having a concentration in said water between about 0.025 molal and about 1.5 molal, said second compound having a concentration in said water between about 0.1 molal and about six molal, and the quotient of said concentration of said first compound divided by said concentration of said second compound having a maximum value of about 0.25.

8. An improved method for the electrochemical cleansing of semiconductor devices which comprise a body composed of n-type germanium and a rectifier electrode positioned on said body, said electrode containing at least one metal selected from the group consisting of aluminum, gallium and indium, said method comprising the steps of: applying to said rectifier electrode a potential positive with respect to that of an inert electrode immersed in an electrolytic solution; and dipping into said solution a plurality of times the portion of said body on which said rectifier electrode is positioned, said solution consisting essentially of water, a first compound selected from the group consisting of sodium hydroxide and potassium hydroxide, and a second compound selected from the group consisting of sodium cyanide and potassium cyanide, said first compound having a concentration in said water between about 0.025 molal and about 1.5 molal, said second compound having a concentration in said water between about 0.1 molal and about six molal, and the quotient of said concentration of said first compound divided by said concentration of said second compound having a maximum value of about 0.25.

9. The method of claim 8, wherein said solution is maintained during said dipping step at a temperature between about 90 degrees centigrade and the boiling point of said solution, wherein said concentration of said first compound is approximately one molal and said concentration of second compound is approximately four molal, and wherein said potential applied to said rectifier electrode has a value of about three volts with respect to said potential of said inert electrode.

10. An improved process for electrochemically cleansing transistors which comprise a body composed of n-type germanium, and emitter, collector and base electrodes positioned on said body, one of said emitter and collector electrodes containing a metal selected from the group consisting of aluminum, gallium and indium, said method comprising the steps of: applying to said one electrode a potential positive with respect to an inert electrode immersed in an electrolytic solution; and dipping into said solution a plurality of times the portion of said body on which said one electrode is positioned, said solution consisting of water, a first compound selected from the group consisting of sodium hydroxide and potassium hydroxide, and a second compound selected from the group consisting of sodium cyanide and potassium cyanide, said first compound having a concentration in said water between about 0.025 molal and about 1.5 molal, said second compound having a concentration in said water between about 0.1 molal and about six molal, and the quotient of said concentration of said first compound divided by said concentration of said second compound having a maximum value of about 0.25.

11. The method of claim 6, wherein said first substance consists essentially of potassium hydroxide, said second substance consists essentially of potassium cyanide, and said semiconductive material is n-type germanium.

12. A method for cleansing a semiconductor device which comprises a body of semiconductive material and a rectifier electrode positioned thereon containing at least one metal selected from the group consisting of aluminum, gallium and indium, said method comprising the steps of: applying an electrolyte to said electrode and the portion of said body surrounding said electrode while maintaining said electrode at a potential positive with respect to said electrolyte, said electrolyte consisting essentially of water and a substance supplying cyanide ions thereto, said substance being composed of at least one compound selected from the group consisting of sodium cyanide and potassium cyanide, and having a concentration such that the cyanide ion concentration in said water is between about 0.1 molal and about six molal.

13. A method according to claim 11, wherein said body is constituted of n-type germanium and said solution is maintained at a temperature between about 90° C. and the boiling point of said solution.

References Cited in the file of this patent

UNITED STATES PATENTS

| | | |
|---|---|---|
| 768,818 | Nelson | Aug. 30, 1904 |
| 1,961,752 | Fink | June 5, 1934 |
| 2,299,054 | Harshaw | Oct. 13, 1942 |
| 2,698,780 | Logan et al. | Jan. 4, 1955 |
| 2,738,294 | Spence | Mar. 13, 1956 |
| 2,783,197 | Herbert | Feb. 26, 1957 |
| 2,793,146 | Crane et al. | May 21, 1957 |
| 2,850,444 | Armstrong et al. | Sept. 2, 1958 |
| 2,902,419 | Carasso et al. | Sept. 1, 1959 |